United States Patent
Shimada

[11] Patent Number: 5,905,548
[45] Date of Patent: May 18, 1999

[54] LIQUID CRYSTAL DISPLAY DEVICE WITH LARGE APERTURE RATIO

[75] Inventor: Shinji Shimada, Kashihara, Japan

[73] Assignee: Sharp Kabushiki Kaisha, Osaka, Japan

[21] Appl. No.: 09/006,267

[22] Filed: Jan. 13, 1998

[30] Foreign Application Priority Data

Feb. 25, 1997 [JP] Japan ..................................... 9-040487

[51] Int. Cl.$^6$ .............................. G02F 1/136; H01L 27/12
[52] U.S. Cl. ................................ 349/38; 349/43; 349/111; 349/122
[58] Field of Search .................................. 349/38, 39, 42, 349/43, 44, 110, 111, 122; 257/57, 72; 345/90, 91, 92

[56] References Cited

U.S. PATENT DOCUMENTS

| | | | |
|---|---|---|---|
| 5,414,547 | 5/1995 | Matsuo et al. | 349/44 |
| 5,446,562 | 8/1995 | Sato | 349/42 |
| 5,459,596 | 10/1995 | Ueda et al. | 349/39 |
| 5,499,123 | 3/1996 | Mikoshiba | 359/59 |
| 5,585,951 | 12/1996 | Noda et al. | 349/122 |
| 5,641,974 | 6/1997 | Den Boer et al. | 257/59 |
| 5,717,224 | 2/1998 | Zhang | 349/43 |

FOREIGN PATENT DOCUMENTS 5-216067  8/1993  Japan .
5-289111  11/1993  Japan .

*Primary Examiner*—Hung Xuan Dang
*Assistant Examiner*—Tai V. Duong
*Attorney, Agent, or Firm*—Dike, Bronstein, Roberts & Cushman, LLP; David G. Conlin

[57] ABSTRACT

A liquid crystal display device is provided which has a large aperture ratio and which can prevent any leak occurrence and/or short circuiting between a pixel electrode and the opposite electrode. An organic interlayer dielectric film having a low dielectric constant is formed on a glass substrate and on a thin film transistor, also on a bus line for supplying an electric signal to the thin film transistor. Pixel electrodes operative to apply an electric field to the liquid crystal through the thin film transistor are formed on the organic interlayer dielectric film. An inorganic interlayer dielectric film having a high dielectric constant which is comprised of silicon nitride is formed on the pixel electrodes, and additional capacity electrodes are formed on the high dielectric-constant inorganic dielectric film in such a way that they partially overlie individual pixel electrodes, the additional capacity electrodes being operative to intercept light so as not to allow light transmission through a space between adjacent pixel electrodes.

9 Claims, 1 Drawing Sheet

LIQUID CRYSTAL DISPLAY DEVICE WITH LARGE APERTURE RATIO

BACKGROUND OF THE INVENTION

The present invention relates to a liquid crystal display device for use as a display unit, such as a viewing display or projection display.

Hitherto, there has been known an active matrix liquid crystal display using a thin film transistor wherein an additional capacity electrode is provided in parallel relation to a gate bus line in order to restrain the application of a DC field to liquid crystal molecules which may result from an optimum-opposite-voltage deflection attributable to a capacity change due to the movement of liquid crystal molecules. Liquid crystal displays of this type have a drawback that the aperture ratio is proportionally lowered by the area of the additional capacity electrode. In an attempt to eliminate this drawback, it has been proposed that an additional capacity electrode is formed of a transparent conductive film (Japanese Patent Application Laid-Open Publication No. HEI 5-289111) as shown in FIG. 2. The liquid crystal display device shown in FIG. 2 includes a gate electrode 25 formed on a glass substrate 21, a gate insulating film 26 formed over the gate electrode 25 and glass substrate 21, and a thin film transistor 40 containing the gate electrode 25, with a pixel electrode 31 formed over a portion other than the thin film transistor 40 region containing the gate electrode 25. Further, the liquid crystal display device includes a passivation film 32 formed on the pixel electrode 31, and an additional capacity electrode 33 comprised of the transparent conductive film which is formed on the passivation film 32. The pixel electrode 31, additional capacity electrode 33, and the passivation film 32 interposed between the two electrodes 31, 33 constitute an additional capacity section. The device has liquid crystal 30 filled between the glass substrate 21 and a glass substrate 22 on which is formed an opposite electrode 23. Unfortunately, however, the liquid crystal display device having the additional capacity electrode comprised of a transparent conductive film poses a problem such that the transparent conductive film formed at an early stage of the manufacturing process is liable to a property change and the like at a later stage which may be a cause of misalignment in the process of semiconductor manufacture.

Therefore, with a view to solving this problem there has been proposed a liquid crystal display device having an additional capacity electrode formed after formation of the gate electrode, the additional capacity electrode being comprised of a transparent conductive film. FIG. 3 shows, as one example of such a liquid crystal display device, a partial sectional view of an active matrix liquid crystal display device incorporating a low-temperature poly-silicon thin film transistor. In FIG. 3, reference numeral 1 designates a glass substrate; 2 designates a poly-silicon semiconductor layer formed on the glass substrate 1; 3 designates a phosphorus ion doped poly-silicon region of the poly-silicon semiconductor layer 2; 4 designates a gate insulating film formed on the glass substrate 1 as well as on the poly-silicon semiconductor layer 2; 5 designates a gate electrode formed on the gate insulating film 4 on the poly-silicon semiconductor layer 2; 6 designates an interlayer dielectric film formed on the gate insulator film 4 and on the gate electrode 5; 7 designates a source electrode; 8 designates a drain electrode; and 9 designates an organic interlayer dielectric film formed on the interlayer dielectric film 6, and on the source electrode 7 and drain electrode 8. An additional capacity electrode 13 is formed between the gate electrodes 5, 5 on the organic interlayer dielectric film 9, then an inorganic interlayer dielectric film 14 is formed on the organic interlayer dielectric film 9 and on the additional capacity electrode 13, and then a pixel electrode 15 is formed on the inorganic interlayer dielectric film 14 and in a contact hole 19 provided on the drain electrode 8. In this way, the additional capacity electrode 13 is formed from a transparent conductive film after formation of the gate electrode 5, whereby it is intended that any deficiency such as property change of the transparent conductive film is prevented so that good matching can be assured in the process of fabrication.

However, in such a liquid crystal display device wherein the additional capacity electrode 13 comprised of a transparent conductive film is formed after formation of the gate electrode 5, there is no element for insulating the pixel electrode 15 and the opposite electrode (not shown) from each other, and this poses the problem of leak occurrence and/or short circuiting between the pixel electrode 15 and the opposite electrode.

SUMMARY OF THE INVENTION

Therefore, it is an object of the present invention to provide a liquid crystal display device which has a large aperture ratio and which can prevent leak occurrence and/or short circuiting between a pixel electrode and an opposite electrode.

In order to achieve the aforementioned object, there is provided a liquid crystal display device including two substrates with liquid crystal filled therebetween, and having formed on at least one of the two substrates a plurality of non-linear elements and a bus line for inputting electric signals into the plurality of non-linear elements, the liquid crystal display device comprising:

a low dielectric-constant organic insulating film formed on the substrate and over the plurality of non-linear elements and the bus line;

a plurality of pixel electrodes formed on the low dielectric-constant organic insulating film and operative to apply electric fields to the liquid crystal through the plurality of non-linear elements;

a high dielectric-constant inorganic insulating film formed over the plurality of pixel electrodes; and a plurality of additional capacity electrodes formed on the high dielectric-constant inorganic insulating film in such a way that they partially overlie individual pixel electrodes, the additional capacity electrodes being operative to intercept light so as not to allow light transmission through a space between adjacent pixel electrodes.

According to the liquid crystal display device of the present invention, the additional capacity portion which consists of the pixel electrodes, high dielectric-constant inorganic insulating film, and additional capacity electrodes is operative to supplement the liquid crystal capacity. The low dielectric-constant organic insulating film formed between the bus line and the additional capacity electrodes can easily be formed by coating, for example, a resin material or the like to a desired thickness within a several micron range with no much time required in that connection, so that any increase in the bus line capacity can be restrained. The surface of the low dielectric-constant organic insulating film can be made flat and smooth at a low processing temperature of not more than 300° C., and the surface of pixel electrodes formed thereon can be made smooth accordingly. Further, by virtue of the high dielectric-constant insulating film formed on the pixel electrodes, the pixel electrodes and the opposite electrodes can be insulated from each other. Therefore, any leak or short circuiting between any pixel electrode and the corresponding opposite electrode can be prevented. Further, the provision of additional capacity electrodes which act to intercept light so as not to allow light transmission through a space between adjacent pixel electrodes can eliminate the need for a light-screening film to be provided on the opposite substrate, whereby a larger display contrast can be obtained.

If a black conductive material, such as titanium oxide, is used for the additional capacity electrodes, reflected light rays can be restrained. Therefore, it is possible to obtain a liquid crystal display device of a very high quality level. In the case where additional capacity electrode and opposite electrode are connected to each other, there is no possibility of the liquid crystal being affected by any electric field in respect of molecular orientation. Nor is there any possibility of short circuit trouble due to short circuiting of upper and lower electrodes of the liquid crystal layer, that is, pixel electrode and opposite electrode, through additional capacity electrode. Therefore, conforming article yield can be improved and the cost of manufacture can be reduced.

In an embodiment, the low dielectric-constant organic insulating film has a specific inductive capacity of not more than 3.5.

According to the liquid crystal display device of an embodiment of the present invention, the specific inductive capacity of the low dielectric-constant organic insulating film formed between the bus line and the additional capacity electrodes is set to the level of not more than 3.5, whereby the capacity of the bus line can be reduced.

In an embodiment, the high dielectric-constant inorganic insulating film has a specific inductive capacity of more than 3.5.

According to the liquid crystal display device of an embodiment of the present invention, the capacity of the additional capacity portion which consists of the pixel electrodes, high dielectric-constant inorganic insulating film, and additional capacity electrodes can be made larger.

In an embodiment, the low dielectric-constant organic insulating film is a polymeric compound having a glass transition point at a temperature of 200° C. or more.

According to the liquid crystal display device of an embodiment of the present invention, the low dielectric-constant organic insulating film is formed of a polymeric compound having a glass transition point at a temperature of 200° C. or more, that is, high heat resistance. Therefore, it is possible to form the high dielectric-constant inorganic insulating film by using a CVD (chemical vapor deposition) apparatus after the low dielectric-constant organic insulating film having been formed of the polymeric compound. Thus, a high dielectric constant inorganic insulating film of good quality can be obtained which has good coverage and fewer pin holes. Therefore, the thickness of the high dielectric-constant inorganic insulating film can be reduced to the order of 100 nm, it being thus possible to reduce the distance between each pixel electrode and the corresponding additional capacity electrode thereby to increase the capacity of the additional capacity portion which consists of pixel electrodes, high dielectric-constant inorganic insulating film, and additional capacity electrodes.

In an embodiment, the thickness of the low dielectric-constant organic insulating film is larger than the thickness of the high dielectric-constant inorganic insulating film.

According to the liquid crystal display device of an embodiment of the present invention, by increasing the thickness of the low dielectric-constant organic insulating film relative to the thickness of the high dielectric-constant inorganic insulating film it is possible to reduce the capacity of the bus line which is dependent upon the high dielectric-constant inorganic insulating film between the bus line and the additional capacity electrodes and, on the other hand, to increase the capacity of the additional capacity portion which consists of pixel electrodes, high dielectric-constant inorganic insulating film, and additional capacity electrodes.

In an embodiment, the low dielectric-constant organic insulating film is a polyimide resin.

According to the liquid crystal display device of an embodiment of the present invention, by forming the low dielectric-constant organic insulating film of a polyimide resin having very high heat resistance it is possible to form the high dielectric-constant inorganic insulating film by using a CVD apparatus at a subsequent stage. Thus, a high dielectric-constant inorganic insulating film of good quality can be readily obtained which has good coverage and fewer pin holes.

In an embodiment, the high dielectric-constant inorganic insulating film includes a silicon oxide or silicon nitride film.

According to the liquid crystal display device of an embodiment of the present invention, by forming a high dielectric-constant inorganic insulating film, including a silicon oxide or silicon nitride film, over the plurality of pixel electrodes, it is possible to increase the specific inductive capacity of the high dielectric-constant inorganic insulating film. Thus, it is possible to readily increase the capacity of the additional capacity portion which consists of pixel electrodes, high dielectric-constant inorganic insulating film, and additional capacity electrodes.

In an embodiment, the surface of the additional capacity electrodes is a metal oxide film.

According to the liquid crystal display device of an embodiment of the present invention, by forming the additional capacity electrodes of an anodizable metal, such as tantalum, anodizing the surface of the additional capacity electrodes, thereby forming a metal oxide film on the additional capacity electrodes, it is possible to insulate the additional capacity electrodes and the opposite electrodes from each other thereby to prevent short circuiting between additional capacity electrode and opposite electrode.

In an embodiment, the high dielectric-constant inorganic insulating film on the plurality of pixel electrodes is at least partially open.

According to the liquid crystal display device of an embodiment of the present invention, by forming a multiplicity of small holes, for example, in the high dielectric-constant inorganic insulating film on a display region of the pixel electrodes it is possible to prevent any leak between pixel electrode and opposite electrode while preventing any voltage drop at pixel electrode.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The liquid crystal display device in accordance with the present invention will now be described in further detail on the basis of the illustrated embodiment.

Figure 1:
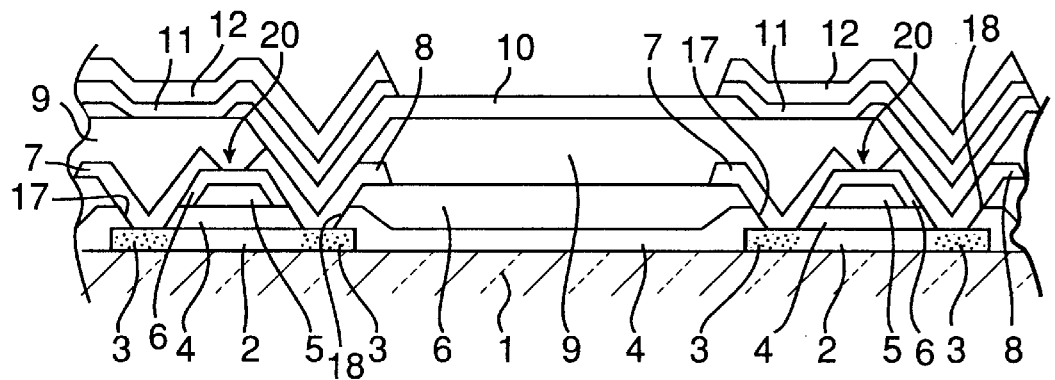
FIG. 1 is a sectional view showing a main portion of a display drive panel formed with a thin film transistor in a liquid crystal display device representing one embodiment of the present invention.
Figure 2:
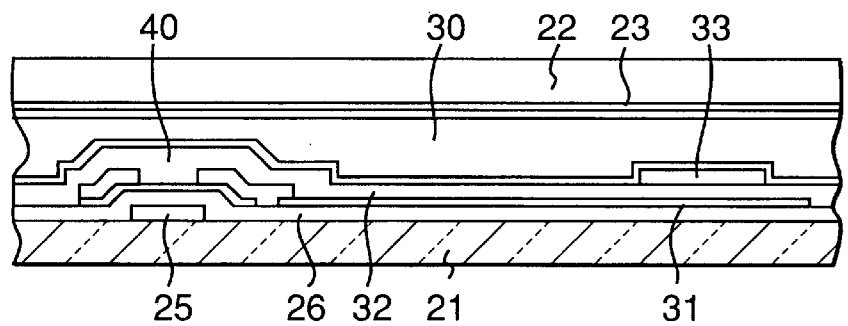
FIG. 2 is a sectional view showing a main portion of a prior art liquid crystal display device.
Figure 3:
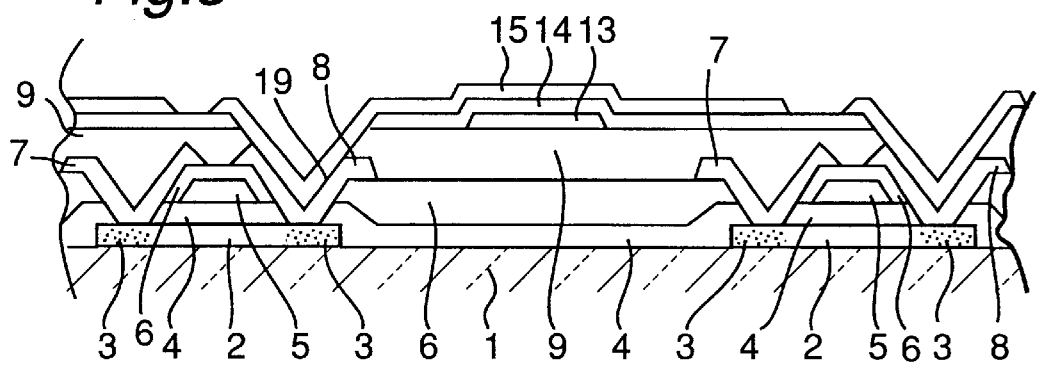
FIG. 3 is a sectional view of a main portion of an active matrix liquid crystal display device using a low temperature poly-silicon thin film transistor.

FIG. 1 is a partial sectional view of one form of liquid crystal display device embodying the invention. In FIG. 1, numeral 1 designates a glass substrate; 2 designates a poly-silicon semiconductor layer; 3 designates a doped poly-silicon region of the poly-silicon semiconductor layer 2; 4 designates a gate insulating film; 5 designates a gate electrode; 6 designates an interlayer insulating film; 7 designates a source electrode; 8 designates a drain electrode; 9 designates an organic interlayer insulating film; 10 designates a pixel electrode; 11 designates an inorganic interlayer insulating film; and 12 designates an additional capacity electrode.

The liquid crystal display device is fabricated in the following way.

As FIG. 1 shows, an amorphous silicon film is deposited on the glass substrate 1 by employing a CVD (chemical vapor deposition) apparatus. In this case, if necessary, a base coat film may be deposited in advance on the glass substrate 1 by using silicon oxide, silicon nitride, tantalum oxide, or the like. The amorphous silicon film is crystallized by using excimer laser to form a poly-silicon film. Crystallization of the amorphous silicon film into the poly-silicon film may be carried out by calcination or by a combination of laser and calcination. Next, the poly-silicon layer is formed into a pattern of predetermined shape by photolithography, and phosphorus ion doping is effected by employing an ion doping apparatus with respect to a predetermined portion of the so patterned poly-silicon layer to form a poly-silicon semiconductor layer 2 having an n+ poly-silicon region 3.

Then, a silicon oxide thin film is deposited by using CVD apparatus to form a gate insulating film 4.

Next, an aluminum/silicon alloy film is deposited on the gate insulating film 4, and the deposited film is formed into a pattern of predetermined configuration by photolithography to thereby form a gate electrode 5 and a bus line (not shown).

Next, a silicon oxide thin film is deposited by using CVD apparatus to thereby form a silicon oxide film on the gate insulating film 4 and gate electrode 5 overlying the poly-silicon semiconductor layer 2. The so deposited silicon oxide film is formed into an interlayer insulating film 6 of a predetermined configuration by photolithography and, in conjunction with this, a contact hole 18 is formed on the poly-silicon region 3 of the poly-silicon semiconductor layer 2.

An aluminum film is deposited on the interlayer insulating film 6 overlying the poly-silicon semiconductor layer 2, and the so deposited aluminum film is formed into a pattern of predetermined shape by photolithography to thereby form a source electrode 7, a drain electrode 8, and a bus line (not shown). The poly-silicon semiconductor layer 2, gate electrode 4, source electrode 7, and drain electrode 8, in combination, constitute a thin film transistor 20.

Next, polyimide resin coating is applied over the source electrode 7, drain electrode 8, and bus line (not shown) in combination, the so applied coating is formed into a pattern of a predetermined configuration by photolithography to thereby define an organic interlayer dielectric film 9 comprised of polyimide resin as a low inductivity organic insulating film, and a contact hole on the drain electrode 8.

Next, a deposition of ITO ($In_2O_3$:Sn) is made and the ITO deposit is formed into a pattern of predetermined configuration by photolithography so that a pixel electrode 10 is formed over the drain electrode 8 and organic interlayer insulating film 9.

Then, a silicon nitride thin film is deposited by using CVD apparatus and formed into a pattern of predetermined configuration so that an inorganic interlayer dielectric film 11 comprised of silicon nitride is formed which acts as a high dielectric-constant insulating layer.

Subsequently, a thin titanium film is deposited on the inorganic interlayer dielectric film 11 and is formed into a pattern of predetermined configuration by photolithography to define additional capacity electrodes 12 such that they partially overlie individual pixel electrodes 10 and are operative to intercept light so as not to allow light transmission through a space between adjacent pixel electrodes 10.

The substrate worked in this way and another substrate opposed thereto (not shown) which is formed with opposite electrodes comprised of ITO are each subjected to orientation film coating and orientation treatment in a predetermined direction, followed by spacer spraying. Thereafter, the two glass substrates are bonded together by using a sealing resin material and, after liquid crystal being injected between the substrates, the injection inlet port is sealed, a liquid crystal cell being thus obtained. When the two glass substrates are bonded together, each additional capacity electrode 12 and the corresponding opposite electrode (not shown) should be connected to same terminal so that the two electrodes are of the same potential so as to be able to receive a signal from that terminal. A polarizing plate is mounted to the liquid crystal cell and a liquid crystal driver is mounted in position, and they are connected to the drive circuit and other means. Thus, a liquid crystal display device is obtained. The driver and a part of the drive circuit can be formed by using a poly-silicon thin film transistor on the same glass substrate as the thin film transistor within the display screen.

In this way, according to the arrangement of the above described liquid crystal display device, the organic interlayer insulating film 9 having low dielectric constant and high heat resistance which is formed between the bus line (not shown) and the additional capacity electrodes 12 can easily be formed to a desired thickness within a several micron range with no much time required in that connection, so that any increase in the bus line capacity can be restrained. The surface of the organic interlayer insulating film 9 can be made flat and smooth at a low processing temperature of not more than 300° C., and the surface of pixel electrodes 10 formed thereon can be made flat and smooth accordingly. Therefore, any leak or short circuiting between any pixel electrode 10 and the corresponding opposite electrode (not shown) can be prevented. The provision of additional capacity electrodes 12 in such a way as not to allow light transmission through a space between adjacent pixel electrodes 10 can eliminate the need for a light-screening film to be provided on the opposite substrate (not shown) because the additional capacity electrodes 12 can concurrently act as a light screening film, whereby a larger display contrast can be obtained. Further, by minimizing the overlapping between the inorganic interlayer insulating film 11 and the pixel electrodes 10 it is possible to maximize the aperture ratio. The use of a black conductive material, such as titanium oxide, for the additional capacity electrodes 12 makes it possible to restrain reflected light.

From the standpoint of reducing the capacity of the bus line (not shown), the specific inductive capacity of the organic interlayer insulating film 9 is preferably not more than 3.5 and the thickness of the organic insulating film 9 is preferably 1 μm or more.

In order to secure the required capacity of the additional capacity portion consisting of the pixel electrodes 10, inorganic interlayer insulating film 11, and additional capacity electrodes 12, the specific inductive capacity of the inorganic interlayer insulating film 11 is preferably more than 3.5.

By forming the organic interlayer insulating film 9 from a polymeric compound having a glass transition point at a temperature of 200° C. or more, that is, high heat resistance, it is possible to form the overlying high dielectric-constant inorganic interlayer insulating film 11 by using the CVD technique. Accordingly, it is possible to produce a good quality inorganic interlayer insulating film 11 which has good coverage and fewer pin holes. At the same time, the thickness of the inorganic interlayer insulating film 11 can be reduced to the order of 100 nm, it being thus possible to reduce the distance between each pixel electrode 10 and the corresponding additional capacity electrode 12 thereby to increase the additional capacity.

By forming the inorganic interlayer insulating film 11 of silicon oxide it is possible to readily increase the specific inductive capacity of the inorganic interlayer insulating film 11, it being thus possible to readily increase the capacity of the additional capacity portion which consists of pixel electrodes, high dielectric-constant inorganic insulating film, and additional capacity electrodes. The inorganic interlayer insulating film 11 may be formed of silicon oxide, but it is noted that since silicon nitride generally has a specific inductive capacity on the order of 7, whereas the specific inductive capacity of the silicon oxide is of the order of 4, the use of silicon nitride permits the formation of a thicker film in the case where the same capacity is secured, it being thus possible to lower the frequency of short circuiting between pixel electrode and opposite electrode. The inorganic interlayer insulating film 11 may be a laminated insulating film including a silicon oxide film or silicon nitride film.

In the case where any anodizable metal, such as tantalum, is used for the additional capacity electrodes 12, short circuiting between additional capacity electrode 12 and opposite electrode can be prevented by anodizing the surface to cause a metal oxide film to be formed thereon.

In the foregoing embodiment, the inorganic insulating film on the display region of pixel electrode 10 is removed. Alternatively, a multiplicity of small holes may be provided on the inorganic insulating film overlying the display region of pixel electrode 10, whereby any leak between pixel electrode 10 and opposite electrode (not shown) can be prevented while any voltage drop at pixel electrode 10 is prevented. If there is no leak possibility, the inorganic insulting film, as is described above, may be completely removed except for the region in which additional capacity electrodes 12 are formed.

By connecting additional capacity electrode 12 to opposite electrode, the additional capacity electrode 12 is made to have the same potential as the opposite electrode, so that any unnecessary electric field can be prevented from being applied to liquid crystal molecules present between the additional capacity electrode and the opposite electrode. Therefore, even in a condition such that leak from the additional capacity electrode 12 may occur there is no possibility of leak trouble.

In the above described embodiment, the liquid crystal display device comprises a thin film transistor 20 of polysilicon formed on the glass substrate 1. It is noted, however, that the present invention may be applied to a liquid crystal display device having a nonlinear element of amorphous silicon formed on the substrate, or a liquid crystal display device having a thin film transistor formed on a quartz substrate.

In the foregoing embodiment, phosphorus ion doping is carried out in the formation of the polysilicon semiconductor layer 2; but other element than phosphorus, say, boron or the like may be used. Instead of doping, it is possible to perform pattern forming after n+ silicon deposition.

In the foregoing embodiment, the gate insulating film 4 and the interlayer insulating film 6 are formed of silicon oxide, but it is possible to form them of silicon nitride.

In the foregoing embodiment, for the organic interlayer insulating film 9, various materials, such as acrylic resin, polyimide resin, polyamide-imide resin, and polyamide resin, may be used. When subsequent stages are considered, however, a material having a glass transition point of 200° C. or more, preferably 300° C. or more, is preferred.

In the foregoing embodiment, pixel electrode 10 is formed of ITO. In the case where the liquid crystal display device is of the reflection type, pixel electrodes may be formed of a metal material, such as aluminum. The gate electrode 5, bus line, source electrode 7, drain electrode 8, and additional capacity electrode 12 may be of any conductive material having a specified conductivity. For example, aluminum, tantalum, titanium, chromium, molybdenum, copper, doped silicon, and ITO, and alloys of these materials may be used.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid crystal display device including two substrates with liquid crystal filled therebetween, and having formed on at least one of the two substrates a plurality of non-linear elements and a bus line for inputting electric signals into the plurality of non-linear elements, the liquid crystal display device comprising:

a low dielectric-constant organic insulating film formed on the substrate and over the plurality of non-linear elements and the bus line;

a plurality of pixel electrodes formed on the low dielectric-constant organic insulating film and operative to apply electric fields to the liquid crystal through the plurality of non-linear elements;

a high dielectric-constant inorganic insulating film formed over the plurality of pixel electrodes; and a plurality of additional capacity electrodes formed on the high dielectric-constant inorganic insulating film in such a way that they partially overlie individual pixel electrodes, the additional capacity electrodes being operative to intercept light so as not to allow light transmission through a space between adjacent pixel electrodes.

2. A liquid crystal display device as claimed in claim 1, wherein:

the low dielectric-constant organic insulating film has a specific inductive capacity of not more than 3.5.

3. A liquid crystal display device as claimed in claim 1, wherein:

the high dielectric-constant inorganic insulating film has a specific inductive capacity of more than 3.5.

4. A liquid crystal display device as claimed in claim 1, wherein:

the low dielectric-constant organic insulating film is a polymeric compound having a glass transition point at a temperature of 200° C. or more.

5. A liquid crystal display device as claimed in claim 1, wherein:

the thickness of the low dielectric-constant organic insulating film is larger than the thickness of the high dielectric-constant inorganic insulating film.

6. A liquid crystal display device as claimed in claim 1, wherein:

the low dielectric-constant organic insulating film is a polyimide resin.

7. A liquid crystal display device as claimed in claim 1, wherein:

the high dielectric-constant inorganic insulating film includes a silicon oxide or silicon nitride film.

8. A liquid crystal display device as claimed in claim 1, wherein:

the surface of the additional capacity electrodes is a metal oxide film.

9. A liquid crystal display device as claimed in claim 1, wherein:

the high dielectric-constant inorganic insulating film on the plurality of pixel electrodes is at least partially open.

* * * * *